United States Patent
Seshita (10) Patent No.: US 8,937,503 B2
(45) Date of Patent: *Jan. 20, 2015

(54) SWITCH CONTROL CIRCUIT, SEMICONDUCTOR DEVICE, AND RADIO COMMUNICATION DEVICE

(71) Applicant: Kabushiki Kaisha Toshiba, Tokyo (JP)

(72) Inventor: Toshiki Seshita, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/086,011

(22) Filed: Nov. 21, 2013

(65) Prior Publication Data
US 2014/0077863 A1    Mar. 20, 2014

Related U.S. Application Data

(63) Continuation of application No. 13/485,049, filed on May 31, 2012, now Pat. No. 8,604,863.

(30) Foreign Application Priority Data

Feb. 17, 2012    (JP) .................................. 2012-33119

(51) Int. Cl.
| H03K 17/00 | (2006.01) |
| H03K 17/10 | (2006.01) |
| H03K 17/62 | (2006.01) |
| H03K 17/693 | (2006.01) |
| H03K 19/0185 | (2006.01) |
| H04B 1/48 | (2006.01) |

(52) U.S. Cl.
CPC ............ *H03K 17/002* (2013.01); *H03K 17/102* (2013.01); *H03K 17/6221* (2013.01); *H03K 17/693* (2013.01); *H03K 19/018521* (2013.01); *H04B 1/48* (2013.01)
USPC ............................ 327/403; 327/415; 327/564

(58) Field of Classification Search
USPC .................. 327/403, 404, 415, 416, 564–566
See application file for complete search history.

(56) References Cited

U.S. PATENT DOCUMENTS

| 5,420,534 A | 5/1995 | Elabd |
| 2013/0141258 A1 | 6/2013 | Seshita |

FOREIGN PATENT DOCUMENTS

JP    2009-027487 A    2/2009

*Primary Examiner* — William Hernandez
(74) *Attorney, Agent, or Firm* — Posz Law Group, PLC (57) ABSTRACT

A switch control circuit has a first terminal, a second terminal, a third terminal, a serial-parallel converter, a selector, a driver circuit and a tri-state buffer. The serial-parallel converter converts a serial switching control signal inputted from the third terminal into first parallel switching control signals when the first terminal is at a first power-supply potential. The selector selects either the first parallel switching control signals converted by the serial-parallel converter or second parallel switching control signals inputted into the second and third terminals, depending on the potential of the first terminal. The driver circuit converts potential levels of the first parallel switching control signals or the second parallel switching control signals selected by the selector and generates parallel switching control signals with potential levels capable of switching a switch circuit.

20 Claims, 9 Drawing Sheets

(12) United States Patent — US 8,937,503 B2

SWITCH CONTROL CIRCUIT, SEMICONDUCTOR DEVICE, AND RADIO COMMUNICATION DEVICE

CROSS REFERENCE TO RELATED APPLICATIONS

This application is a continuation of U.S. patent application Ser. No. 13/485,049 filed on May 31, 2012 which is based upon and claims the benefit of priority from the prior Japanese Patent Application No. 2012-33119, filed on Feb. 17, 2012, the entire contents of which are incorporated herein by reference.

FIELD

Embodiments of the present invention relate to a switch control circuit for switching a switch circuit, a semiconductor device, and a radio communication device.

BACKGROUND

In a high-frequency circuit unit of a mobile terminal such as cellular phone and smartphone, a transmitter circuit and a receiver circuit are selectively connected to a common antenna through a switch circuit for high-frequency signals. Conventionally, a HEMT (High Electron Mobility Transistor) using a compound semiconductor has been used as a switch element of such a high-frequency signal switch circuit. However, due to the demands for price reduction and downsizing in recent years, it is suggested to use a MOSFET (Metal Oxide Semiconductor Field Effect Transistor) formed on a silicon substrate, instead of the HEMT.

Note that a general MOSFET formed on a silicon substrate has such problems that the parasitic capacitance between the source or drain electrode and the silicon substrate is large, and that power loss of high-frequency signals is large since silicon is a semiconductor. Thus, a technique for forming the high-frequency switch circuit on an SOI (Silicon On Insulator) substrate has been proposed.

Recent mobile terminals operate in multimode and multiband, and the number of ports required for a high-frequency switch has been increased to over ten. The increase in the number of ports inevitably increases the number of bits of a signal required to control the connection state of the switch. For example, an SP10T switch for switching the connections between an antenna terminal and ten RF terminals requires ten connection states, and therefore the number of bits required for the control signal is four. In order to input a 4-bit control signal as parallel signals, four terminals are naturally required. This input manner is hereinafter referred to as a parallel input manner. On the other hand, it is also possible to input a serial data signal in synchronization with a clock signal. This input manner is hereinafter referred to as a serial input manner. The serial input manner has an advantage that only one data input terminal is required even when the number of ports increases. Therefore, demand for the serial input manner has been increased recently although the parallel input manner is mainly used in the conventional high-frequency switch.

Basically, either of the input manners is exclusively used in a high-frequency switch IC, but it is desirable to electrically switch the input manners in order to improve the versatility of the high-frequency switch IC. However, in order to realize this configuration, input terminals based on the respective input manners and terminals for electrically switching the input manners are required, which leads to a problem that the number of pads increase correspondingly.

BRIEF DESCRIPTION OF THE DRAWINGS

FIG. 2 is a circuit diagram showing an example of the circuit configuration of a unit selection circuit 6a.

DETAILED DESCRIPTION

According to one embodiment, a switch control circuit has:
a first terminal, a second terminal, and a third terminal;
a serial-parallel converter configured to convert a serial switching control signal inputted from the third terminal into first parallel switching control signals in synchronization with a clock signal inputted from the second terminal when the first terminal is at a first power-supply potential, and to stop this operation when the first terminal is at a second power-supply potential;
a selector configured to select either the first parallel switching control signals converted by the serial-parallel converter or second parallel switching control signals inputted into the second and third terminals, depending on the potential of the first terminal;
a driver circuit configured to convert potential levels of the first parallel switching control signals or the second parallel switching control signals selected by the selector, and to generate parallel switching control signals with potential levels capable of switching a switch circuit; and
a tri-state buffer configured to comprise an input terminal connected to the serial-parallel converter and an output terminal connected to the third terminal, the tri-state buffer capable of setting the output terminal to high impedance.

Embodiments of the present invention will now be explained with reference to the accompanying drawings.
(First Embodiment)

Figure 1:
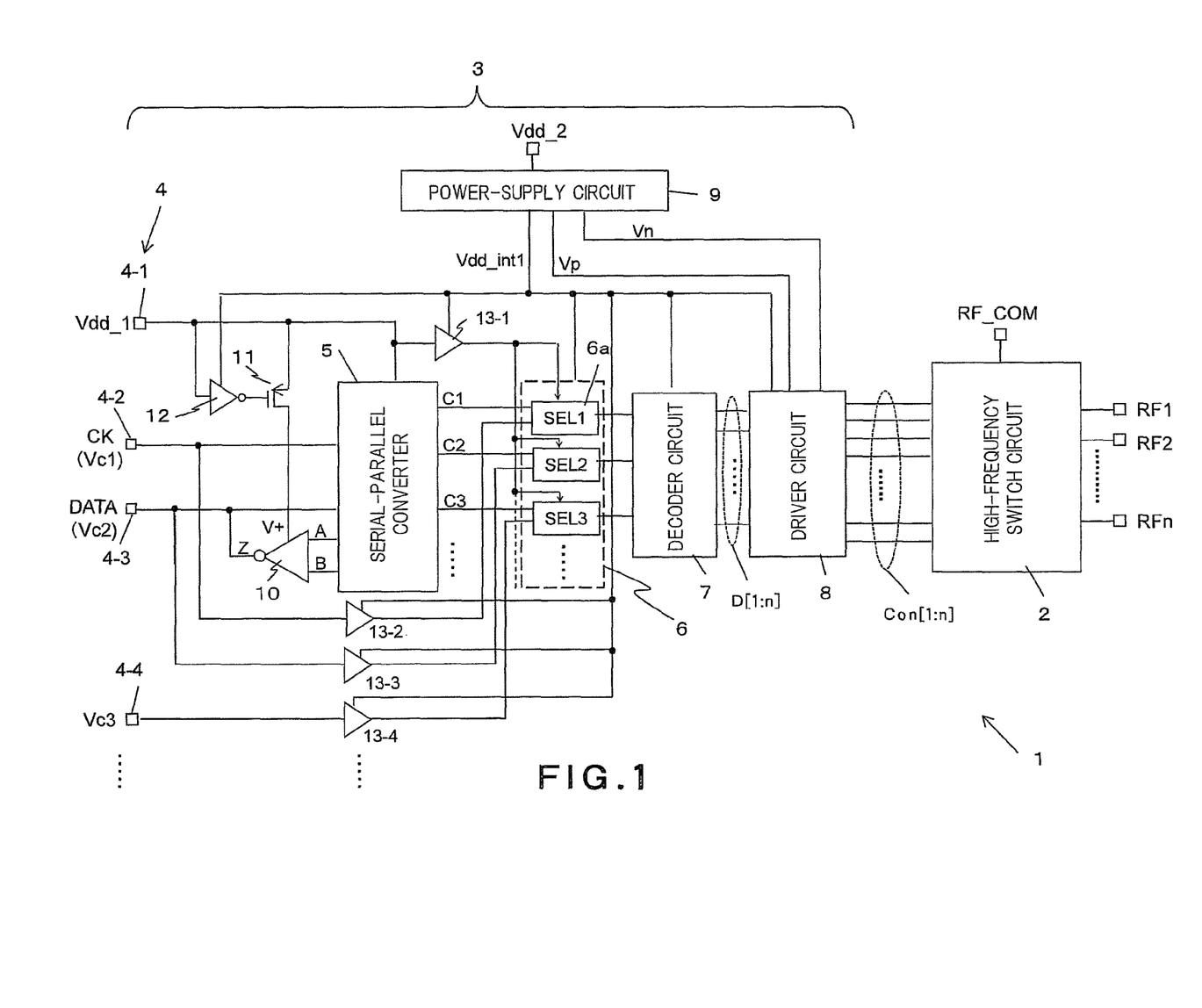
FIG. 1 is a block diagram showing a schematic structure of a semiconductor device 1 having a switch control circuit 3 according to a first embodiment.

FIG. 1 is a block diagram showing a schematic structure of a semiconductor device 1 having a switch control circuit 3 according to a first embodiment. The semiconductor device 1 of FIG. 1 can be implemented in one chip, but it may be implemented in a plurality of chips or may be partially implemented in discrete components.

The semiconductor device 1 of FIG. 1 has mainly a high-frequency switch circuit 2 and the switch control circuit 3.

The high-frequency switch circuit 2 selects one of a plurality of RF signal terminals RF 1 to RF n, and connects it to an antenna terminal RF_COM. The RF signal terminals RF 1 to RF n are connected to a sending/receiving circuit (not shown in FIG. 1). The sending/receiving circuit supports a plurality of wireless standards, and generates RF signals each being different corresponding to each wireless standard. As mentioned later, a radio communication device has at least one semiconductor device 1 of FIG. 1. Note that the number of RF signal terminals switched by the high-frequency switch circuit 2 should not be limited to four.

The switch control circuit 3 has an input terminal group 4 including first to fourth terminals 4-1 to 4-4, a serial-parallel converter 5, a selector 6, a decoder circuit 7, a driver circuit 8, a power-supply circuit 9, a tri-state buffer 10, a PMOS transistor (power-supply control circuit) 11, an inverter 12, and a plurality of input buffers 13 (13-1 to 13-4).

The serial-parallel converter 5 converts a serial switching control signal for controlling the switching operation of the high-frequency switch circuit 2 into first parallel switching control signals in synchronization with a clock signal CK. More specifically, the serial-parallel converter 5 converts a serial switching control signal inputted from the third terminal 4-3 into first parallel switching control signals in synchronization with a clock signal inputted from the second terminal 4-2 when the first terminal 4-1 has a first power-supply potential, and to stop this operation when the first terminal 4-1 has a second power-supply potential.

The serial-parallel converter 5 incorporates a register (not shown). The register can retain the serial switching control signal inputted from the second terminal, identification information of the semiconductor device 1 of FIG. 1, etc., and the information retained in the register can be outputted to the outside from the second terminal 13-2, as mentioned later.

Potential Vdd_1 of the first terminal 4-1 is set to first power-supply potential when performing serial-parallel conversion by the serial-parallel converter 5, and is set to a second power-supply potential when inputting second parallel switching control signals into the second to fourth terminals 4-2 to 4-4 without performing serial-parallel conversion by the serial-parallel converter 5.

The second terminal 4-2 is inputted with the clock signal CK synchronized with the serial switching control signal when the first power-supply potential is supplied to the first terminal 4-1, and is inputted with a 1-bit signal Vc 1 included in the second parallel switching control signals when the second power-supply potential is supplied to the first terminal 4-1.

When the first power-supply potential is supplied to the first terminal 4-1, the third terminal 4-3 is inputted with the serial switching control signal DATA, and the serial switching control signal DATA retained in the serial-parallel converter 5 is outputted depending on the request from the outside. Further, when the second power-supply potential is supplied to the third terminal 4-3, the first terminal 4-1 is inputted with a 1-bit signal Vc 2 included in the second parallel switching control signals and different from the 1-bit signal inputted from the second terminal 4-2.

The selector 6 selects either the first parallel switching control signals converted by the serial-parallel converter 5 or the second parallel switching control signals inputted into the second and third terminals 4-2 and 4-3, depending on the potential of the first terminal 4-1. A selection control signal S for the selector 6 is the output signal from the input buffer 13-1. The input terminal of the input buffer 13-1 is connected to the first terminal 4-1, and the potential level of the selection control signal S changes depending on whether the potential Vdd_1 of the first terminal 4-1 is the first power-supply potential or the second power-supply potential.

The driver circuit 8 converts the potential levels of the first parallel switching control signals or the second parallel switching control signals selected by the selector 6, and generates parallel switching control signals having potential levels capable of switching the high-frequency switch circuit 2.

The tri-state buffer 10 is used to output the information retained in the register in the serial-parallel converter 5 to the outside through the third terminal 4-3, as stated above. The input terminal of the tri-state buffer 10 is connected to the output terminal of the serial-parallel converter 5, while the output terminal of the tri-state buffer 10 is connected to the third terminal 4-3 and can be set to high impedance.

As stated above, the third terminal 4-3 is also used to input the clock signal CK or the 1-bit signal Vc 2 included in the second parallel switching control signals from the outside. Accordingly, when the signal Vc 2 is inputted into the third terminal 4-3 from the outside, the output terminal of the tri-state buffer 10 is set to high impedance to prevent the collision of the input/output signals.

A power-supply terminal V+ of the tri-state buffer 10 is connected to the PMOS transistor 11. The PMOS transistor 11 has a source connected to the first terminal 4-1, a drain connected to the power-supply terminal V+ of the tri-state buffer 10, and a gate connected to the output terminal of the inverter 12 for inverting the potential level of the first terminal 4-1.

For example, when the first terminal 4-1 becomes High level, the PMOS transistor 11 is turned on and the power-supply terminal V+ of the tri-state buffer 10 becomes High level, and thus the output terminal of the tri-state buffer 10 has a logic obtained by inverting the input signal. Further, when the first terminal 4-1 becomes High level, the serial-parallel converter 5 performs serial-parallel conversion. Accordingly, in the mode applied to this case, the serial switching control signal DATA is inputted from the outside, and the switch control circuit 3 performs serial-parallel conversion to generate the first parallel switching control signals.

To the contrary, when the first terminal 4-1 becomes Low level, the PMOS transistor 11 is turned off, and the output terminal of the tri-state buffer 10 is set to high impedance. Further, the serial-parallel converter 5 stops the operation of serial-parallel conversion. Accordingly, in the mode applied to this case, the second parallel switching control signals are inputted from the outside through the second to fourth terminals 4-2 to 4-4.

Here, the back gate of the PMOS transistor 11 is set floating. It is a prerequisite to form the switch control circuit 3 according to the present embodiment on an SOI substrate to process high-speed signals, and thus the back gate can be made floating easily.

By setting the back gate of the PMOS transistor 11 floating, when the first terminal 4-1 is at Low level (0 V), the gate of the PMOS transistor 11 becomes High level (e.g., 1.8 V) and the PMOS transistor 11 is completely cut off, and thus the output terminal of the tri-state buffer 10 is set to high impedance. Accordingly, even when High potential is inputted into the third terminal 4-3 from the outside in this state, there is no likelihood that this High potential allows current to flow from the power-supply terminal V+ of the tri-state buffer 10 to the first terminal 4-1 through the PMOS transistor 11, which leads to no likelihood that the potential of the third terminal 4-3 falls.

If the back gate of the PMOS transistor 11 is connected to the source, current flows from the third terminal 4-3 having High potential to the first terminal 4-1 having Low potential through the parasitic diode between the drain and back gate of the PMOS transistor 11, which makes the potential of the third terminal 4-3 fall.

Further, in the case where the PMOS transistor 11 is not arranged and the power-supply terminal V+ of the tri-state buffer 10 is connected directly to the first terminal 4-1, when setting the third terminal 4-3 to High potential, current flows from the first terminal 4-1 into a ground terminal through the power-supply terminal V+ of the tri-state buffer 10, which makes it impossible to set the third terminal 4-3 to a desired High level potential.

On the other hand, in the present embodiment, even when the first terminal 4-1 is at 0 V and the third terminal 4-3 becomes High level, the PMOS transistor 11 can be completely cut off since its back gate is floating, and thus the output terminal of the tri-state buffer 10 can be kept at high impedance, thereby preventing the trouble that the potential of the third terminal 4-3 falls. Accordingly, the third terminal 4-3 can be used as a two-way input/output terminal, which leads to the reduction in the number of terminals.

As stated above, in the switch control circuit 3 according to the present embodiment, when the first terminal 4-1 is at High level, the serial-parallel converter 5 converts the serial switching control signal DATA inputted into the third terminal 4-3 into the second parallel switching control signals and inputs them into the selector 6, while when the first terminal 4-1 is at Low level, the second parallel switching control signals inputted into the second to fourth terminals 4-2 to 4-4 are inputted into the selector 6 through the input buffers 13-2 to 13-4.

When the first terminal 4-1 is at High level, the selector 6 selects the second parallel switching control signals outputted from the serial-parallel converter 5, while when the first terminal 4-1 is at Low level, the selector 6 selects the second parallel switching control signals inputted from the second to fourth terminals 4-2 to 4-4 and passed through the input buffers 13-2 to 13-4.

Figure 2:
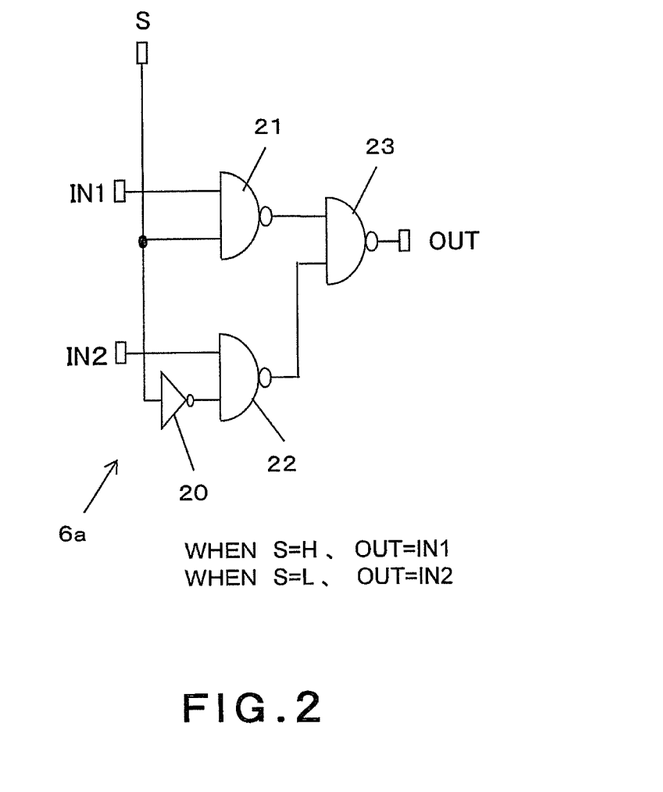

The selector 6 has unit selection circuits 6a each corresponding to each bit signal serving as the second parallel switching control signal. FIG. 2 is a circuit diagram showing an example of the circuit configuration of the unit selection circuit 6a. The unit selection circuit 6a of FIG. 2 has an inverter 20 for generating an inverted signal of the selection control signal S, a first NAND circuit 21 for calculating negative AND between a first input signal IN 1 and the selection control signal S, a second NAND circuit 22 for calculating negative AND between a second input signal and the inverted signal of the selection control signal S, and a third NAND circuit 23 for calculating negative AND between the output signals from the first and second NAND circuits 21 and 22.

The third NAND circuit 23 outputs the first input signal IN 1 when the selection control signal S is High, and outputs the second input signal IN 2 when the selection control signal S is Low.

The number of the output signals from the selector 6 is the same as the number of bits of the second parallel switching control signals. In the example of FIG. 1, the number of bits is three.

The driver circuit 8 has n level shift circuits 8a (n=3 in FIG. 1) for converting the potential levels of the output signals from the selector 6 with respect to each bit.

Figure 3:
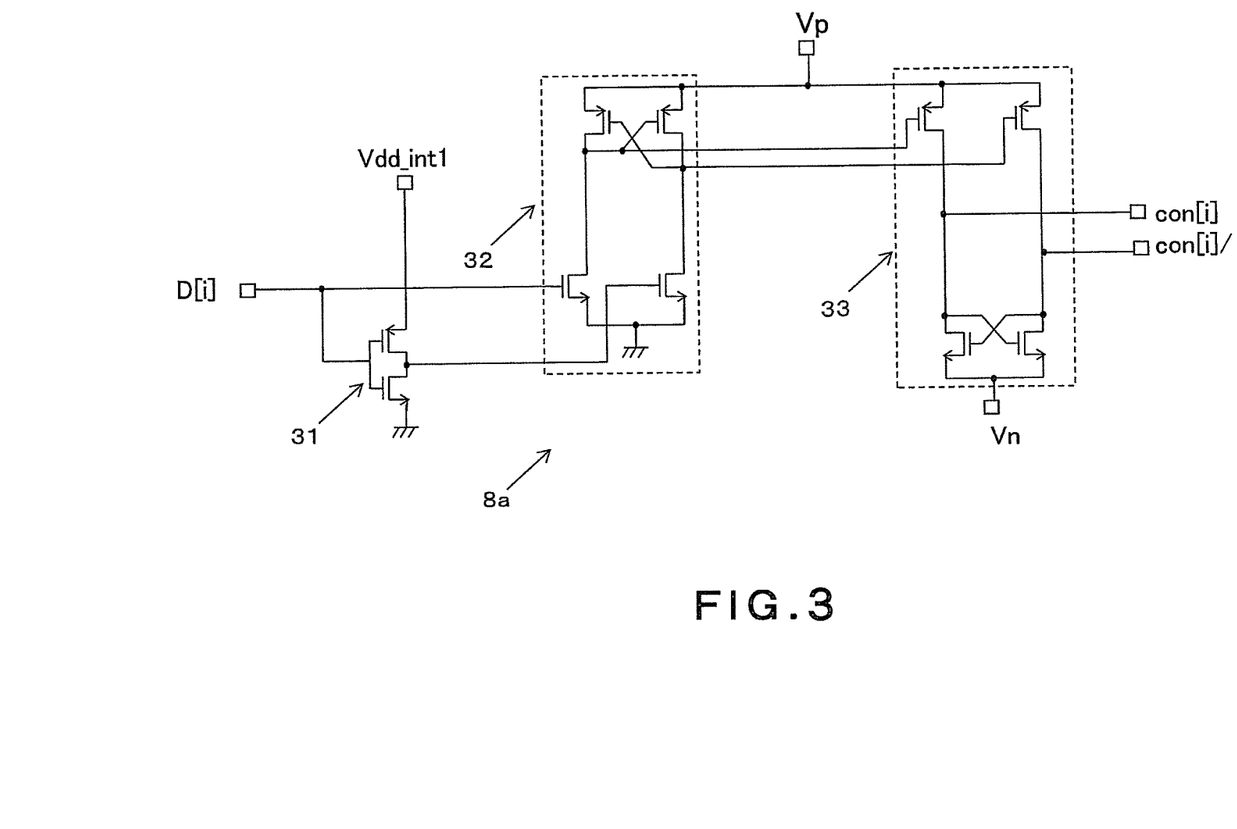
FIG. 3 is a circuit diagram showing an example of the internal structure of a level shift circuit 8a for one bit.

FIG. 3 is a circuit diagram showing an example of the internal structure of the level shift circuit 8a for one bit. The level shift circuit 8a of FIG. 3 has an inverter 31, a former-stage level shifter 32, and a latter-stage level shifter 33.

The inverter 31 sets the High potential of an inverted signal obtained by inverting the input signal to internal power source potential Vdd_int1.

The former-stage level shifter 32 shifts the High level of the output signal from the inverter 31 to the positive potential direction. The latter-stage level shifter 33 shifts the Low level of the output signal from the inverter 31 to the negative potential direction. The former-stage level shifter 32 is supplied with positive power-supply potential Vp, and negative power-supply potential is set to ground potential. The latter-stage level shifter 33 is supplied with the positive power-supply potential Vp and negative power-supply potential Vn. The positive power-supply potential Vp and negative power-supply potential are generated by the power-supply circuit 9.

The power-supply circuit 9 generates the internal power source potential Vdd_int1, the positive power-supply potential Vp, and the negative power-supply potential Vn, based on external power-supply potential Vdd_2. Here, the internal power source potential Vdd_int1 is set within a potential range of $0<Vdd\_int1 \leq Vdd\_2$. It is desirable that the potential Vdd_1 supplied to the first terminal 4-1 and the internal power source potential Vdd_int1 are set to the same potential (e.g., 1.8 V). This makes it possible to equalize the output logic swing of the circuit block supplied with the potential Vdd_1 (the PMOS transistor 11 and the serial-parallel converter 5) to that of the circuit block supplied with the internal power source potential Vdd_int1 (the selector 6, the decoder circuit 7, and the driver circuit 8).

Further, the power-supply circuit 9 generates positive boosting potential Vp (>Vdd_int1) and negative boosting potential Vn using two charge pump systems (not shown).

Figure 4:
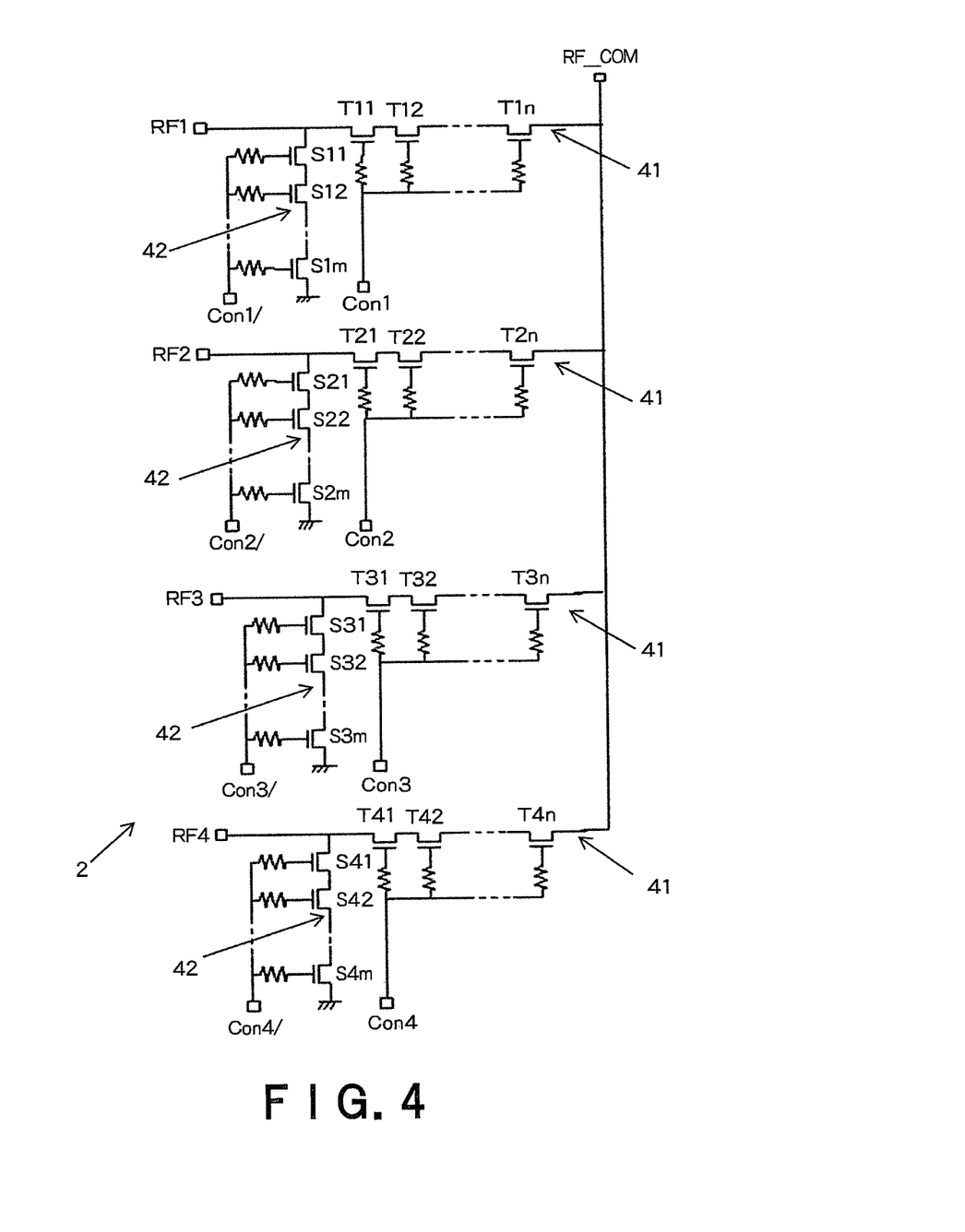
FIG. 4 is a circuit diagram showing the internal structure of an SP4T switch as an example of a high-frequency switch circuit 2.

FIG. 4 is a circuit diagram showing the internal structure of an SP4T (Single-Pole 4-Throw) switch as an example of the high-frequency switch circuit 2. This SP4T switch switches which one of four RF terminals RF 1 to RF 4 should be electrically connected to the common RF terminal RF_COM, depending on parallel switching control signals Con 1 to Con 4.

The SP4T switch of FIG. 4 has through FETs 41 connected in series in multiple stages between the common RF terminal RF_COM and each of the four RF terminals RF 1 to RF 4, and shunt FETs 42 connected in series in multiple stages between each RF terminal and each ground terminal. Threshold voltage Vth of each FET is 0 V, for example.

Voltage swings dozens of volts in transmission operation, and thus the through FETs 41 and the shunt FETs 42 are both connected in series in multiple stages in order to apply this voltage swing to the FETs connected in series and suppress the voltage applied to each FET.

Hereinafter, the operation of the SP4T switch of FIG. 4 will be explained based on an example where the RF terminal RF 1 is electrically connected to the common RF terminal RF_COM. In this case, the control signal Con 1 has High potential (Von), and the through FETs 41 having gates inputted with the control signal Con 1 are turned on, while the shunt FETs 42 connected between the RF terminal RF 1 and the ground terminal are turned off. Further, the other through FETs 41 are turned off, and the other shunt FETs 42 are turned on.

The potential Von of the control signal Con 1 is at a potential level enough to electrically connect the through FETs 41 and make the on-resistance thereof sufficiently small. This potential Von is Vp generated by the power-supply circuit 9 of FIG. 1, having a value of 3.5 V, for example. Potential Voff of the control signals Con 2 to Con 4 is a gate potential capable of keeping the cutoff state of the through FETs 41 even when RF signals are inputted into the RF terminals RF 2 to RF 4.

This potential Voff is Vn generated by the power-supply circuit 9, having a value of −1.5 V, for example.

In the high-frequency switch circuit 2 of FIG. 4, leakage current is generated through off capacitance even when the through FETs 41 are turned off, and this leakage current is passed through the shunt FETs 42.

As stated above, in the first embodiment, some of the input terminals of the switch control circuit 3 (e.g., the second terminal 4-2 and the third terminal 4-3) are inputted with signals each being changed depending on whether the switch control circuit 3 performs serial-parallel conversion or not, which leads to the reduction in the number of input terminals.

Further, in order to utilize the third terminal 4-3 as a two-way input/output terminal, this terminal is connected to the tri-state buffer 10. When inputting a signal into the third terminal 4-3, the output of the tri-state buffer 10 is set to high impedance to prevent the collision of input/output signals. Further, by connecting the power-supply line of the tri-state buffer 10 to the PMOS transistor 11 whose back gate is set floating, the output terminal of the tri-state buffer 10 can be kept at high impedance even when the third terminal 4-3 is High and the PMOS transistor 11 is turned off, which makes it possible to suppress the variation in the potential of the third terminal 4-3.

(Second Embodiment)

A second embodiment explained below is characterized in the internal structure of the tri-state buffer 10 of FIG. 1. The block configuration of the switch control circuit 3 according to the second embodiment is similar to FIG. 1, and thus the explanation thereof will be omitted.

Figure 5:
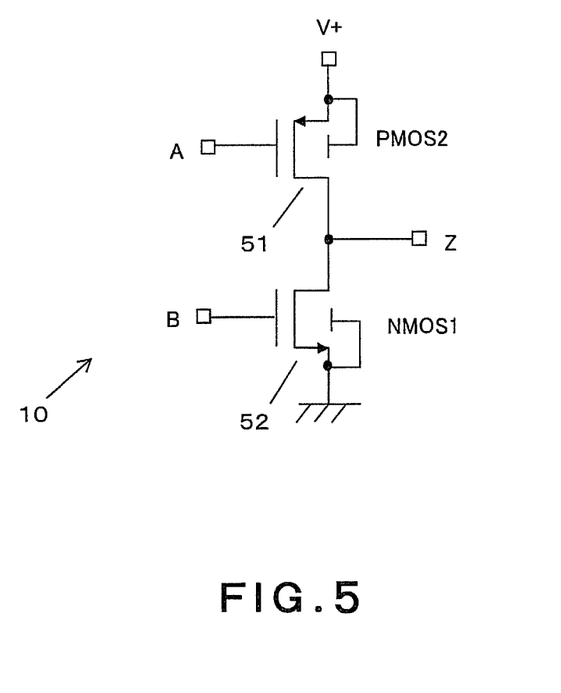
FIG. 5 is a circuit diagram showing the internal structure of a tri-state buffer 10 according to a second embodiment.

FIG. 5 is a circuit diagram showing the internal structure of the tri-state buffer 10 according to the second embodiment. The tri-state buffer 10 of FIG. 5 has a PMOS transistor 51 having a source connected to the power-supply line V+ and a drain connected to the third terminal 4-3, and an NMOS transistor 52 having a drain connected to the third terminal 4-3 and a source which is grounded. The back gate of the PMOS transistor 51 is connected to the source and the power-supply line V+, while the back gate of the NMOS transistor 52 is connected to the source and a ground terminal.

As stated above, the transistor 51/52 in the tri-state buffer 10 has the back gate connected to the source in order to fix the potential, by which drain breakdown voltage is increased and the third terminal 4-3 has higher ESD immunity compared to the case where the back gate is set floating.

Further, in the present embodiment, the on-resistance of the PMOS transistor 11 connected to the power-supply terminal V+ of the tri-state buffer 10 is set smaller than the on-resistance of the PMOS transistor 51 in the tri-state buffer 10. Accordingly, there is no likelihood that current drive performance of the tri-state buffer 10 is deteriorated even when the PMOS transistor 11 is connected between the first terminal 4-1 and the power-supply terminal V+ of the tri-state buffer 10.

In order to set the on-resistance of the PMOS transistor 11 sufficiently smaller than the on-resistance of the PMOS transistor 51, the ratio of gate width to gate length of the PMOS transistor 11 should be set larger than that of the PMOS transistor 51.

For example, the ratio of gate width to gate length of the PMOS transistor 11 is set to 4000 μm to 0.25 μm, and that of the PMOS transistor 51 is set to 300 μm to 0.35 μm.

As stated above, in the second embodiment, the transistor 51, 52 in the tri-state buffer 10 connected to the third terminal 4-3 has the back gate connected to the source, by which the drain breakdown voltage is improved and the third terminal 4-3 has higher ESD immunity. Further, the on-resistance of the PMOS transistor 11 connected to the power-supply line of the tri-state buffer 10 is set sufficiently smaller than the on-resistance of the PMOS transistor 51 in the tri-state buffer 10, by which the current drive performance of the input buffer 13-1 is not deteriorated even when the PMOS transistor 11 is arranged.

In FIG. 5, the transistor 51, 52 in the tri-state buffer 10 has the back gate connected to the source, but the back gate of the PMOS transistor 51 may be floating. In this case, an effect similar to the first embodiment can be obtained even when the PMOS transistor 11 of FIG. 1 is omitted. That is, when the first terminal 4-1 is Low and the third terminal 4-3 is High, if the back gate of the PMOS transistor 51 in the tri-state buffer 10 is floating, the output terminal of the tri-state buffer 10 can be kept at high impedance and thus there is no likelihood that current flows from the third terminal 4-3 to the first terminal 4-1 through the output terminal of the tri-state buffer 10.

(Third Embodiment)

A third embodiment explained below is characterized in that the input terminal of the input buffer 13-1 for outputting the selection control signal S to the selector 6 is connected a terminal different from the first terminal 4-1. In this case, the number of input terminals of the switch control circuit 3 is increased by one, and this configuration can be used when no particular trouble will be caused by increasing the number of terminals.

Figure 6:
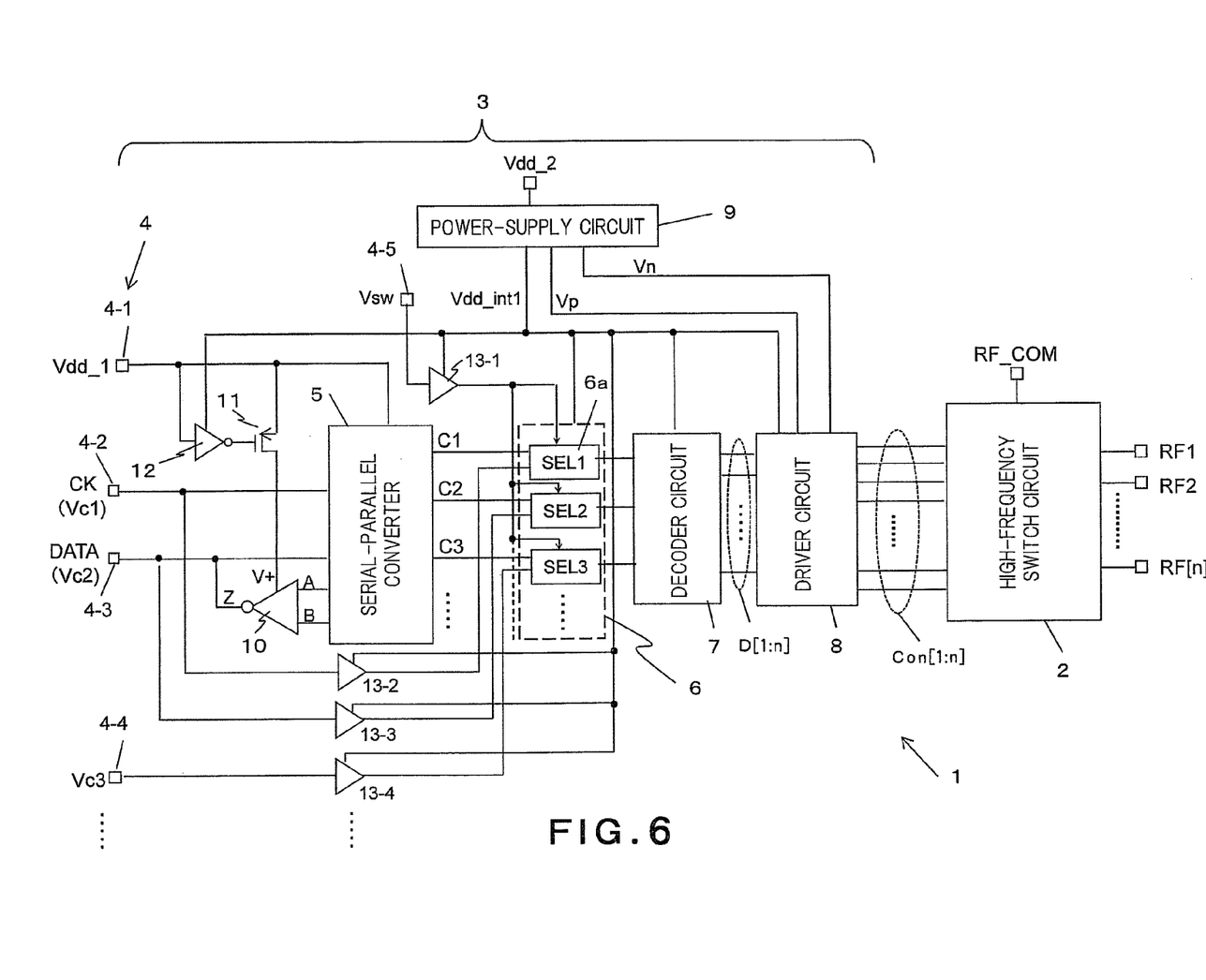
FIG. 6 is a block diagram showing a schematic structure of the semiconductor device 1 having the switch control circuit 3 according to a third embodiment.

FIG. 6 is a block diagram showing a schematic structure of the semiconductor device 1 having the switch control circuit 3 according to the third embodiment. The semiconductor device 1 of FIG. 6 is different from FIG. 1 in that the input terminal of the input buffer 13-1 for outputting the selection control signal S to the selector 6 is connected to a terminal 4-5 which is different from the first terminal 4-1, and there is no other differences in configuration. Potential Vsw of this terminal 4-5 determines the logic of the selection control signal S for the selector 6.

(Fourth Embodiment)

A fourth embodiment explained below is characterized in providing a function for shifting to a low-power consumption mode when the serial-parallel converter 5 performs serial-parallel conversion.

Figure 7:
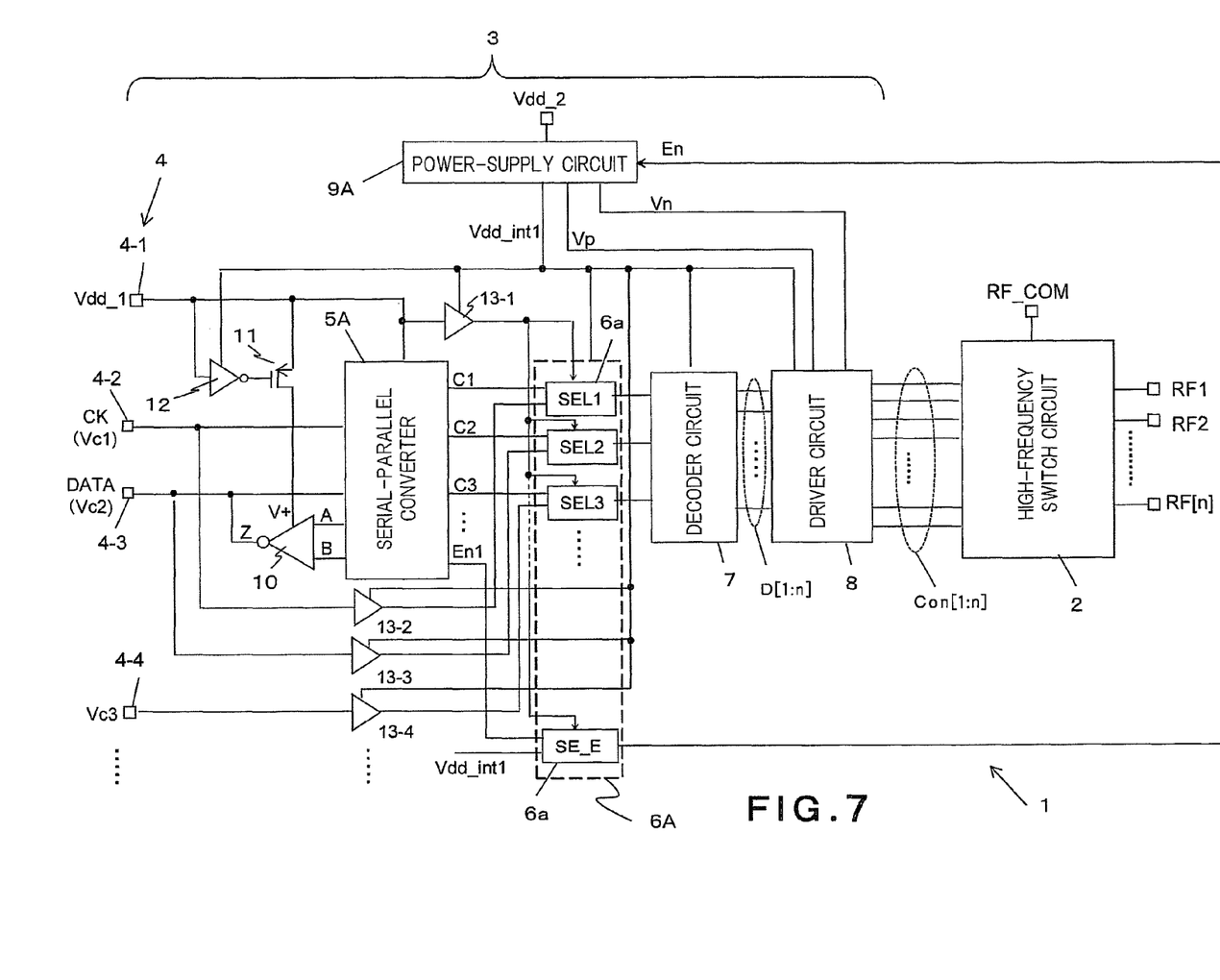
FIG. 7 is a block diagram showing a schematic structure of the semiconductor device 1 having the switch control circuit 3 according to a fourth embodiment.

FIG. 7 is a block diagram showing a schematic structure of the semiconductor device 1 having the switch control circuit 3 according to the fourth embodiment. The switch control circuit 3 of FIG. 7 is different from FIG. 1 in the internal structure of a serial-parallel converter 5A, a selector 6A, and a power-supply circuit 9A.

The serial-parallel converter 5A of FIG. 7 has a first enable terminal En 1 for outputting information as to whether or not to shift to the low-power consumption mode when performing serial-parallel conversion. The signal potential of the first enable terminal En 1 can be set through the third terminal 4-3, for example. When setting the low-power consumption mode, the first enable terminal is set to Low potential.

The selector 6A of FIG. 7 is obtained by adding one unit selection circuit 6a to the selector 6 of FIG. 1. The added unit selection circuit 6a selects either the output signal from the first enable terminal En 1 of the serial-parallel converter 5A or the inner potential Vdd_int1 generated by the power-supply circuit 9A, based on the selection control signal S from the input buffer 13-1. More concretely, the unit selection circuit 6a selects the output signal from the first enable terminal En 1 when performing serial-parallel conversion by the serial-parallel converter 5, and selects the inner potential Vdd_int1 when inputting the second parallel switching control signals from the outside without performing serial-parallel conversion.

The signal En selected by the unit selection circuit 6a is inputted into the power-supply circuit 9A. For example, when the serial-parallel converter 5 performs serial-parallel conversion, the unit selection circuit 6a outputs a signal potential corresponding to the output signal from the first enable terminal En 1. Accordingly, if the output signal from the first enable terminal En 1 has a signal potential for the low-power consumption mode, the signal potential corresponding thereto is inputted into the power-supply circuit 9A. Correspondingly, the power-supply circuit 9A stops the operation of its internal charge pump (not shown), and operates with low power consumption. Then, absolute values for the potential levels of power-supply voltages Vp and Vn supplied to the driver circuit 8 are reduced, and the operation of the driver circuit 8 is stopped.

As stated above, in the fourth embodiment, when the serial switching control signal DATA is inputted into the third terminal 4-3 and the serial-parallel converter 5 performs serial-parallel conversion, the power-supply circuit 9A can be set to the low-power consumption mode, which makes it possible to partially set the circuit blocks in the switch control circuit 3 to the low-power consumption mode without additionally arranging a terminal for setting the low-power consumption mode.

(Fifth Embodiment)

In addition to the characteristics of the fourth embodiment, a fifth embodiment explained below is characterized in that operation with low power consumption becomes available also when inputting the second parallel switching control signals from the outside without performing serial-parallel conversion.

Figure 8:
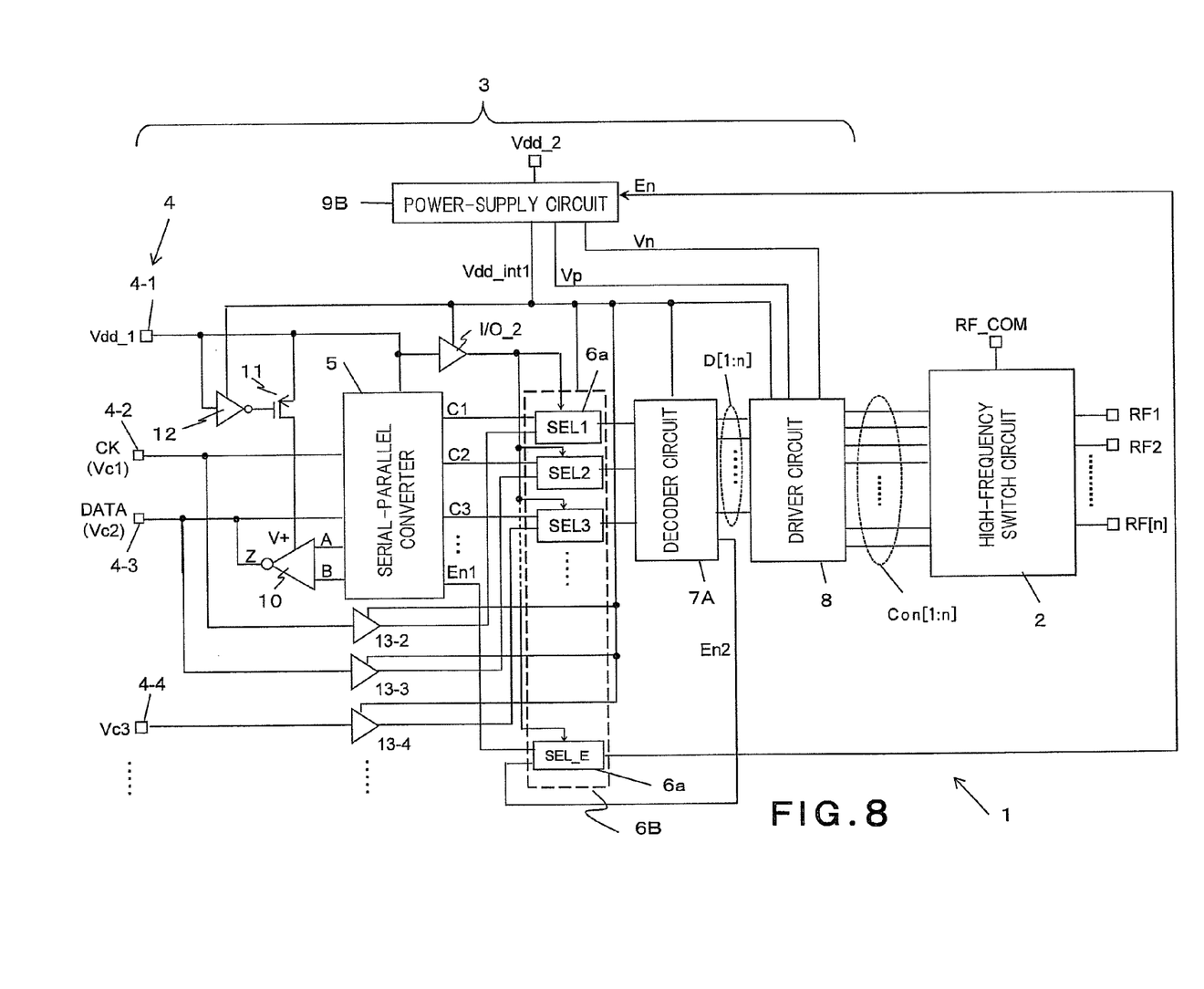
FIG. 8 is a block diagram showing a schematic structure of the semiconductor device 1 having the switch control circuit 3 according to a fifth embodiment.

FIG. 8 is a block diagram showing a schematic structure of the semiconductor device 1 having the switch control circuit 3 according to the fifth embodiment. The switch control circuit 3 of FIG. 8 is different from FIG. 7 in the structure of a selector 6B, a decoder circuit 7A, and a power-supply circuit 9B.

The decoder circuit 7A of FIG. 8 has a second enable terminal En 2 for outputting information as to whether or not to shift to the low-power consumption mode. The signal potential of this second enable terminal En 2 can be set by a terminal or a control circuit not shown. For example, when setting the low-power consumption mode, the second enable terminal En 2 is set to Low potential.

The unit selection circuit 6a in the selector 6B selects either the signal from the first enable terminal En 1 of the serial-parallel converter 5 or the signal from the second enable terminal En 2 of the decoder circuit 7, based on the selection control signal S from the input buffer 13-1. More concretely, the unit selection circuit 6a selects the signal from the first enable terminal En 1 when performing serial-parallel conversion by the serial-parallel converter 5, and selects the signal from the second enable terminal En 2 when inputting the second parallel switching control signals from the outside without performing serial-parallel conversion by the serial-parallel converter 5.

The signal selected by the unit selection circuit 6a is inputted into the power-supply circuit 9B. For example, the signal selected by the unit selection circuit 6a is at Low level, the power-supply circuit 9B shifts to the low-power consumption mode, and suppresses power consumption in the power-supply circuit 9B while stopping the operation of the driver circuit 8.

As stated above, in the fifth embodiment, it is possible to shift to the low-power consumption mode not only when performing serial-parallel conversion by the serial-parallel converter circuit 5 but also when inputting the second parallel switching control signals from the outside without performing serial-parallel conversion.

Figure 9:
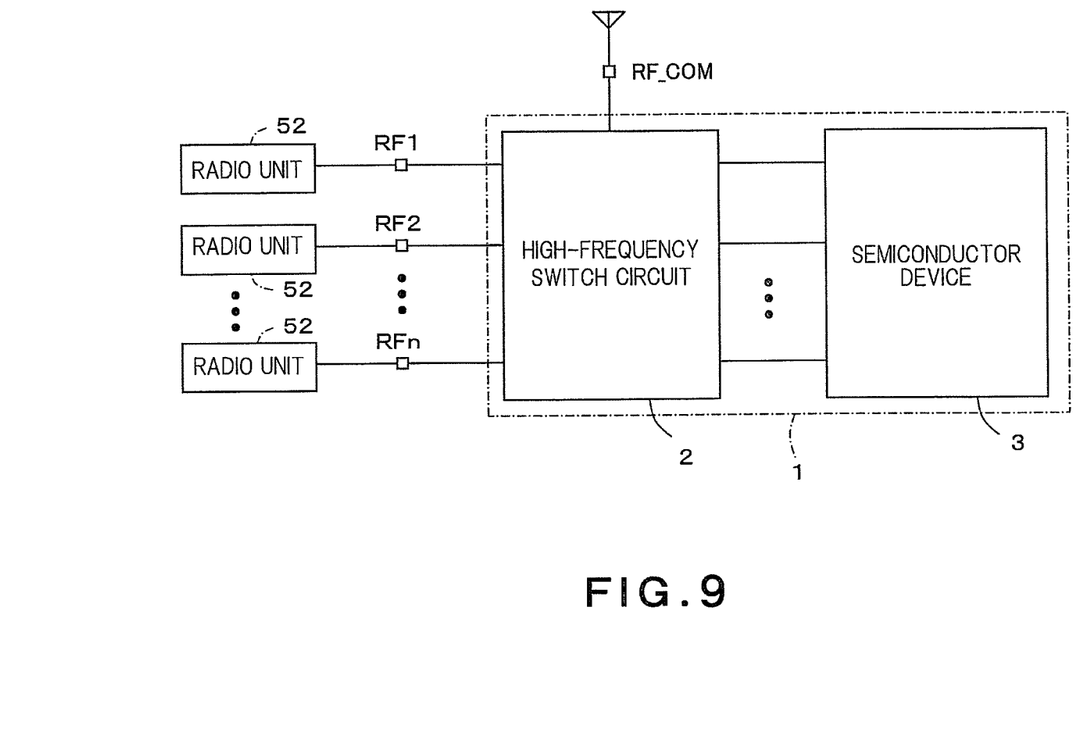
FIG. 9 is a block diagram showing a schematic structure of a radio communication device mounted with the semiconductor device 1 according to any one of the first to fifth embodiments.

FIG. 9 is a block diagram showing a schematic structure of a radio communication device mounted with the semiconductor device 1 according to any one of the first to fifth embodiments. The radio communication device of FIG. 9 is one of various wireless devices such as cellular phone, smartphone, PC, etc. capable of switching a plurality of wireless standards.

A radio communication device 51 of FIG. 9 has a plurality of radio units 52 which are different from each other in at least one of frequency band and wireless standard and perform wireless communication separately, and the above semiconductor device 1 connected to the radio units 52. The radio units 52 and the semiconductor device 1 may be formed as separate chips mounted on a supporting substrate (e.g., printed wiring board), or may be formed on the same semiconductor substrate. Further, a plurality of semiconductor devices 1 may be arranged in the radio communication device 51.

While certain embodiments have been described, these embodiments have been presented by way of example only, and are not intended to limit the scope of the inventions. Indeed, the novel methods and standards described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A switch control circuit, comprising:
a first terminal, a second terminal, and a third terminal;
a serial-parallel converter configured to convert a serial switching control signal inputted from the third terminal into first parallel switching control signals in synchronization with a clock signal;
a selector configured to select either the first parallel switching control signals or second parallel switching control signals inputted into the second and third terminals, depending on the potential of the first terminal;
a driver circuit configured to convert potential levels of the first parallel switching control signals or the second parallel switching control signals, and to generate parallel switching control signals; and
a tri-state buffer including an input terminal connected to the serial-parallel converter and an output terminal connected to the third terminal.

2. The switch control circuit of claim 1, further comprising:
a power-supply control circuit configured to be connected to a power-supply line of the tri-state buffer.

3. The switch control circuit of claim 2,
wherein the power-supply control circuit comprises a first PMOS transistor configured to be connected between the first terminal and a power-supply terminal of the tri-state buffer, a back gate of the first PMOS transistor being floating.

4. The switch control circuit of claim 3,
wherein the tri-state buffer comprises:
a second PMOS transistor configured to comprise a source connected to the power-supply line of the tri-state buffer, a drain connected to the output terminal of the tri-state buffer, and a back gate connected to the source; and a first NMOS transistor configured to comprise a drain connected to the output terminal of the tri-state buffer, a source set to a ground potential, and a back gate connected to the source, a ratio of gate width to gate length (gate width/gate length) of the first PMOS transistor being larger than a ratio of gate width to gate length (gate width/gate length) of the second PMOS transistor.

5. The switch control circuit of claim 1,
wherein the tri-state buffer comprises:
a second PMOS transistor configured to comprise a source connected to a power-supply line of the tri-state buffer, a drain connected to the output terminal of the tri-state buffer, and a back gate which is floating; and
a first NMOS transistor configured to comprise a drain connected to the output terminal of the tri-state buffer and a source set to a ground potential.

6. The switch control circuit of claim 1, further comprising:
a terminal group including one or more terminals each capable of inputting a 1-bit signal in the second parallel switching control signals different from a 1-bit signal inputted from each of the second and third terminals,
wherein the selector selects the second parallel switching control signals inputted from the second terminal, the third terminal, and the terminal group when the first terminal is at a second power-supply potential.

7. The switch control circuit of claim 1, further comprising:
a power-supply circuit configured to generate a power-supply voltage supplied to at least the driver circuit,
wherein the serial-parallel converter generates a first enable signal separately from the first parallel switching control signals and supplies the first enable signal to the power-supply circuit.

8. The switch control circuit of claim 1, further comprising:
a decoder configured to decode the parallel switching control signals selected by the selector; and
a power-supply circuit configured to generate a power-supply voltage supplied to at least the driver circuit,
wherein the serial-parallel converter is configured to generate a first enable signal separately from the first parallel switching control signals and supply the first enable signal to the power-supply circuit,
the decoder is configured to generate a second enable signal separately from output signals of decoding results and supply the second enable signal to the power-supply circuit, the second enable signal indicating that a sleep mode is set,
the power-supply circuit is configured to supply a low-voltage level to the driver circuit in accordance with the first enable signal or the second enable signal, and
the driver circuit is configured to convert potential levels of the output signals from the decoder.

9. A semiconductor device, comprising:
a switch circuit configured to select one of a plurality of high-frequency signals based on parallel switching control signals; and
a switch control circuit configured to generate the parallel switching control signals,
wherein the switch control circuit comprises:
a first terminal, a second terminal, and a third terminal;
a serial-parallel converter configured to convert a serial switching control signal inputted from the third terminal into first parallel switching control signals in synchronization with a clock signal;
a selector configured to select either the first parallel switching control signals or second parallel switching control signals inputted into the second and third terminals, depending on the potential of the first terminal;
a driver circuit configured to convert potential levels of the first parallel switching control signals or the second parallel switching control signals, and to generate parallel switching control signals; and
a tri-state buffer including an input terminal connected to the serial-parallel converter and an output terminal connected to the third terminal.

10. The semiconductor device of claim 9, further comprising:
a power-supply control circuit configured to be connected to a power-supply line of the tri-state buffer.

11. The semiconductor device of claim 10,
wherein the power-supply control circuit comprises a first PMOS transistor configured to be connected between the first terminal and a power-supply terminal of the tri-state buffer, a back gate of the first PMOS transistor being floating.

12. The semiconductor device of claim 11,
wherein the tri-state buffer comprises:
a second PMOS transistor configured to comprise a source connected to the power-supply line of the tri-state buffer, a drain connected to the output terminal of the tri-state buffer, and a back gate connected to the source; and
a first NMOS transistor configured to comprise a drain connected to the output terminal of the tri-state buffer, a source set to a ground potential, and a back gate connected to the source,
a ratio of gate width to gate length (gate width/gate length) of the first PMOS transistor being larger than a ratio of gate width to gate length (gate width/gate length) of the second PMOS transistor.

13. The semiconductor device of claim 9,
wherein the tri-state buffer comprises:
a second PMOS transistor configured to comprise a source connected to a power-supply line of the tri-state buffer, a drain connected to the output terminal of the tri-state buffer, and a back gate which is floating; and
a first NMOS transistor configured to comprise a drain connected to the output terminal of the tri-state buffer and a source set to a ground potential.

14. The semiconductor device of claim 9, further comprising:
a terminal group including one or more terminals each capable of inputting a 1-bit signal in the second parallel switching control signals different from a 1-bit signal inputted from each of the second and third terminals,
wherein the selector selects the second parallel switching control signals inputted from the second terminal, the third terminal, and the terminal group when the first terminal is at a second power-supply potential.

15. A radio communication device, comprising:
a plurality of radio units configured to input and output high-frequency signals corresponding to different wireless standards;
a switch circuit configured to select one of a plurality of high-frequency signals based on parallel switching control signals; and
a semiconductor device configured to generate the parallel switching control signals,
wherein the semiconductor device comprises:
a first terminal, a second terminal, and a third terminal;
a serial-parallel converter configured to convert a serial switching control signal inputted from the third terminal into first parallel switching control signals in synchronization with a clock signal;

a selector configured to select either the first parallel switching control signals or second parallel switching control signals inputted into the second and third terminals, depending on the potential of the first terminal;

a driver circuit configured to convert potential levels of the first parallel switching control signals or the second parallel switching control signals, and to generate parallel switching control signals; and a tri-state buffer including an input terminal connected to the serial-parallel converter and an output terminal connected to the third terminal.

16. The radio communication device of claim 15, further comprising:

a power-supply control circuit configured to be connected to a power-supply line of the tri-state buffer.

17. The radio communication device of claim 16, wherein the power-supply control circuit comprises a first PMOS transistor configured to be connected between the first terminal and a power-supply terminal of the tri-state buffer, a back gate of the first PMOS transistor being floating.

18. The radio communication device of claim 17, wherein the tri-state buffer comprises:

a second PMOS transistor configured to comprise a source connected to the power-supply line of the tri-state buffer, a drain connected to the output terminal of the tri-state buffer, and a back gate connected to the source; and a first NMOS transistor configured to comprise a drain connected to the output terminal of the tri-state buffer, a source set to a ground potential, and a back gate connected to the source, a ratio of gate width to gate length (gate width/gate length) of the first PMOS transistor being larger than a ratio of gate width to gate length (gate width/gate length) of the second PMOS transistor.

19. The radio communication device of claim 15, wherein the tri-state buffer comprises:

a second PMOS transistor configured to comprise a source connected to a power-supply line of the tri-state buffer, a drain connected to the output terminal of the tri-state buffer, and a back gate which is floating; and a first NMOS transistor configured to comprise a drain connected to the output terminal of the tri-state buffer and a source set to a ground potential.

20. The radio communication device of claim 15, further comprising:

a terminal group including one or more terminals each capable of inputting a 1-bit signal in the second parallel switching control signals different from a 1-bit signal inputted from each of the second and third terminals, wherein the selector selects the second parallel switching control signals inputted from the second terminal, the third terminal, and the terminal group when the first terminal is at a second power-supply potential.

* * * * *